(12) United States Patent  
Chen (10) Patent No.: US 8,711,648 B2  
(45) Date of Patent: Apr. 29, 2014

(54) VOLTAGE GENERATING SYSTEM AND MEMORY DEVICE USING THE SAME

(75) Inventor: Chih Jen Chen, Guishan Township, Taoyuan County (TW)

(73) Assignee: Nanya Technology Corporation, Tao-Yuan Hsien (TW)

( * ) Notice: Subject to any disclaimer, the term of this patent is extended or adjusted under 35 U.S.C. 154(b) by 119 days.

(21) Appl. No.: 13/563,312

(22) Filed: Jul. 31, 2012

(65) Prior Publication Data

US 2014/0036611 A1 Feb. 6, 2014

(51) Int. Cl.  
*G11C 5/14* (2006.01)

(52) U.S. Cl.  
CPC . *G11C 5/14* (2013.01); *G11C 5/146* (2013.01)  
USPC .................. 365/226; 365/185.23; 365/189.09

(58) Field of Classification Search  
CPC ............. G11C 5/14; G11C 7/20; G11C 16/30  
USPC ........... 365/226, 227, 185.23, 185.27, 189.09  
See application file for complete search history.

(56) References Cited

U.S. PATENT DOCUMENTS 6,768,354 B2 * 7/2004 Yamazaki et al. ............ 327/143  
8,526,260 B2 * 9/2013 Pyeon ............................ 365/222

* cited by examiner

*Primary Examiner* — Tan Nguyen  
(74) *Attorney, Agent, or Firm* — Morris, Manning & Martin LLP; Juan Carlos A. Marquez (57) ABSTRACT

A voltage generating system and a memory device using the same are disclosed. The voltage generating system includes an internal voltage regulator, configured to supply a current to pull an internal supply voltage to a regulated level and maintain at the regulated level; and a substrate-bias controlled selector, configured to receive a regulator power-up mode signal, a regulating mode signal and a substrate-bias voltage of a substrate, and control the internal voltage regulator such that when the substrate-bias voltage is smaller than a predetermined voltage, the internal voltage regulator powers up and operates normally by respectively taking the regulator power-up mode signal and the regulating mode signal into consideration, and when the substrate-bias voltage is larger than or equal to the predetermined voltage, the internal voltage regulator is disabled. The predetermined voltage is smaller than or equal to a forward voltage of a p-n junction formed with the substrate.

20 Claims, 9 Drawing Sheets

VOLTAGE GENERATING SYSTEM AND MEMORY DEVICE USING THE SAME

BACKGROUND

1. Technical Field

The present invention relates to a memory device, and more particularly relates to a voltage generating system and a memory device using the same.

2. Description of Related Arts

Complementary metal-oxide semiconductor (CMOS) integrated circuits are susceptible to a parasitic circuit effect called latchup. The result of latchup is the shorting of the supply voltage and the ground of the CMOS circuit, which causes destruction of the chip.

Figure 1:
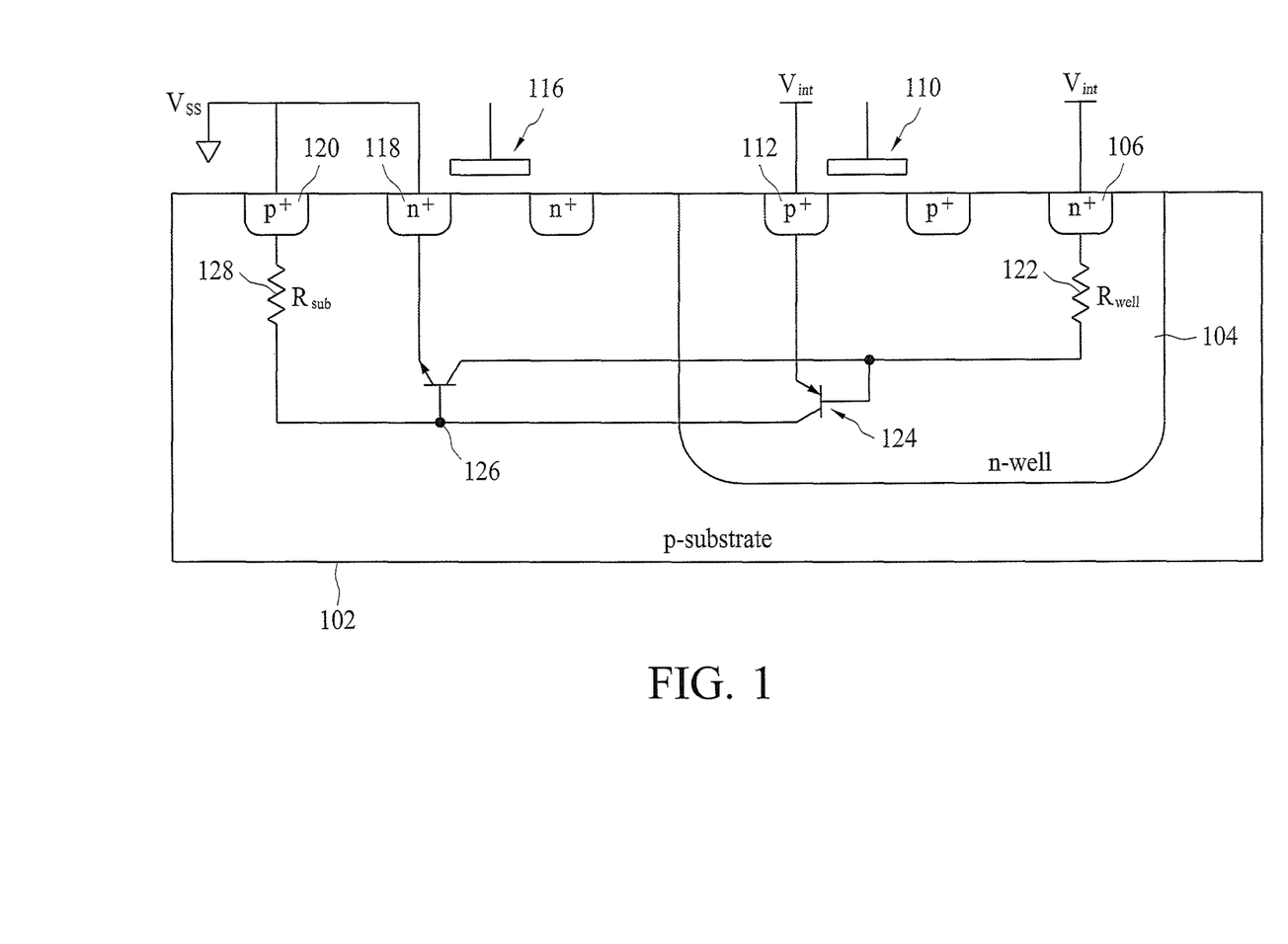
FIG. 1 is a schematic cross-sectional diagram illustrating a portion of a CMOS integrated circuit and the associated parasitic circuit.

FIG. 1 is a schematic cross-sectional diagram illustrating a portion of a CMOS integrated circuit and the associated parasitic circuit.

Referring to FIG. 1, the CMOS integrated circuit is built on a p-substrate 102 with an n-well 104. The n-well 104 has a well contact 106 coupled to a supply voltage $V_{int}$, and the p-substrate 102 has a substrate contact 120 coupled to the ground $V_{ss}$. A portion of the CMOS integrated circuit includes a PMOS transistor 110 disposed at the n-well 104 and an NMOS transistor 116 disposed at the p-substrate 102. The PMOS transistor 110 includes a p+ region 112 that is coupled to the supply voltage $V_{int}$ and the NMOS transistor 116 includes an n+ region 118 that is coupled to the ground $V_{ss}$.

An associated parasitic circuit of the CMOS integrated circuit includes a PNP bipolar junction transistor 124, an NPN bipolar junction transistor 126, a well resistor $R_{well}$ and a substrate resistor $R_{sub}$. The emitter, base and collector of the PNP transistor 124 are respectively formed by the p+ region 112 of the PMOS transistor 110, the n-well 104 and the p-substrate 102. The emitter, base and collector of the NPN transistor 126 are respectively formed by the n+ region 118 of the NMOS transistor 116, the p-substrate 102, and the n-well 104. The well resistor $R_{well}$ couples the base of the PNP transistor 124 to the voltage supply $V_{int}$.

The substrate resistor $R_{sub}$ couples the base of the NPN transistor 126 to the ground $V_{ss}$.

A situation in which the parasitic circuit of the CMOS integrated circuit enters into the high current latchup state is as follows. Suppose the NPN transistor 126 is turned on. A current flows in the well resistor $R_{well}$, raising the base emitter voltage of the PNP transistor 124 and turning on the PNP transistor 124. Then, a current flows in the substrate resistor $R_{sub}$, which in turn raises the base voltage of the NPN transistor 126 and increases the current through the well resistor $R_{well}$, causing a positive feedback condition. The regenerative current effectively creates a low resistive path between the supply voltage $V_{int}$ and the ground $V_{ss}$.

Latchup can be induced by a transient substrate bias voltage of the p-substrate 102 that may occur during power-up of the CMOS integrated circuit. Under normal operating condition, the substrate-bias voltage is pumped to a negative voltage by a substrate-bias pump in order to reduce leakage currents and to prevent latchup from being triggered However, under power-up condition, the substrate-bias is not immediately stable and may be coupled to another voltage through parasitic capacitance of the CMOS integrated circuit. Conventionally, a substrate-bias clamp is used to clamp the substrate-bias voltage to ground $V_{ss}$ during power-up. However, the substrate-bias clamp may not be strong enough to hold the substrate-bias voltage at ground level, and prevent triggering of latchup.

Therefore, it is highly desirable that a more effective mechanism to be provided to prevent latchup in a CMOS integrated circuit device.

SUMMARY

The present invention is directed to a voltage generating system and memory device using the same that disable an internal voltage regulator based on a detected substrate-bias voltage level, so as to effectively control a substrate-bias voltage to be within a bound that could trigger latchup in the memory device.

According to an embodiment, a voltage generating system includes a first internal voltage regulator and a first substrate-bias controlled selector. The first internal voltage regulator is configured to supply a current to pull an internal supply voltage to substantially a regulated level and maintain substantially at the regulated level. The first substrate-bias controlled selector is configured to receive a regulator power-up mode signal, a regulating mode signal and a substrate-bias voltage of a substrate, and control the first internal voltage regulator such that when the substrate-bias voltage is smaller than a first predetermined voltage, the first internal voltage regulator powers up and operates normally by respectively taking the regulator power-up mode signal and the regulating mode signal into consideration, and when the substrate-bias voltage is larger than or equal to the first predetermined voltage, the first internal voltage regulator is disabled. The first predetermined voltage is smaller than or equal to a forward voltage of a p-n junction formed with the substrate.

According to another embodiment, a memory device includes an integrated circuit and a voltage generating system. The integrated circuit is a memory cell array or a memory peripheral circuit. The voltage generating system includes a first internal voltage regulator, a first substrate-bias controlled selector and a power bus. The first internal voltage regulator, configured to supply a current to pull an internal supply voltage to substantially a regulated level and maintain substantially at the regulated level. The first substrate-bias controlled selector is configured to receive a regulator power-up mode signal, a regulating-mode signal and a substrate-bias voltage, and control the first internal voltage regulator such that when the substrate-bias voltage is smaller than a first predetermined voltage, the first internal voltage regulator powers up and operates normally by respectively taking the regulator power-up mode signal and the regulating mode signal into consideration, and when the substrate-bias voltage is larger than or equal to the first predetermined voltage, the first internal voltage regulator is disabled, wherein the first predetermined voltage is smaller than or equal to a forward voltage of a p-n junction formed with the substrate. The power bus is coupled to the integrated circuit and configured to distribute the internal supply voltage to the integrated circuit.

The foregoing has outlined rather broadly the features and technical advantages of the present invention in order that the detailed description of the invention that follows may be better understood. Additional features and advantages of the invention will be described hereinafter, and form the subject of the claims of the invention. It should be appreciated by those skilled in the art that the conception and specific embodiment disclosed might be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

A more complete understanding of the present disclosure may be derived by referring to the detailed description and claims when considered in connection with the Figures, wherein like reference numbers refer to similar elements throughout the Figures as follows:

DESCRIPTION OF THE EMBODIMENTS

The following description of the disclosure accompanies drawings, which are incorporated in and constitute a part of this specification, and illustrate embodiments of the disclosure, but the disclosure is not limited to the embodiments. In addition, the following embodiments can be properly integrated to complete another embodiment.

The present disclosure is directed to a method for testing a mask article. In order to make the present disclosure completely comprehensible, detailed steps and structures are provided in the following description. Obviously, implementation of the present disclosure does not limit special details known by persons skilled in to the art. In addition, known structures and steps are not described in detail, so as not to limit the present disclosure unnecessarily. Preferred embodiments of the present disclosure will be described below in detail. However, in addition to the detailed description, the present disclosure may also be widely implemented in other embodiments. The scope of the present disclosure is not limited to the detailed description, and is defined by the claims.

As discussed in the related art section, CMOS integrated circuits are susceptible to latchup when the CMOS integrated circuit is initially powered up. CMOS memory devices, such as CMOS dynamic random access memories (DRAMs), are particularly prone to latchup during the power up of the memory device, as described in the following.

Figure 2:
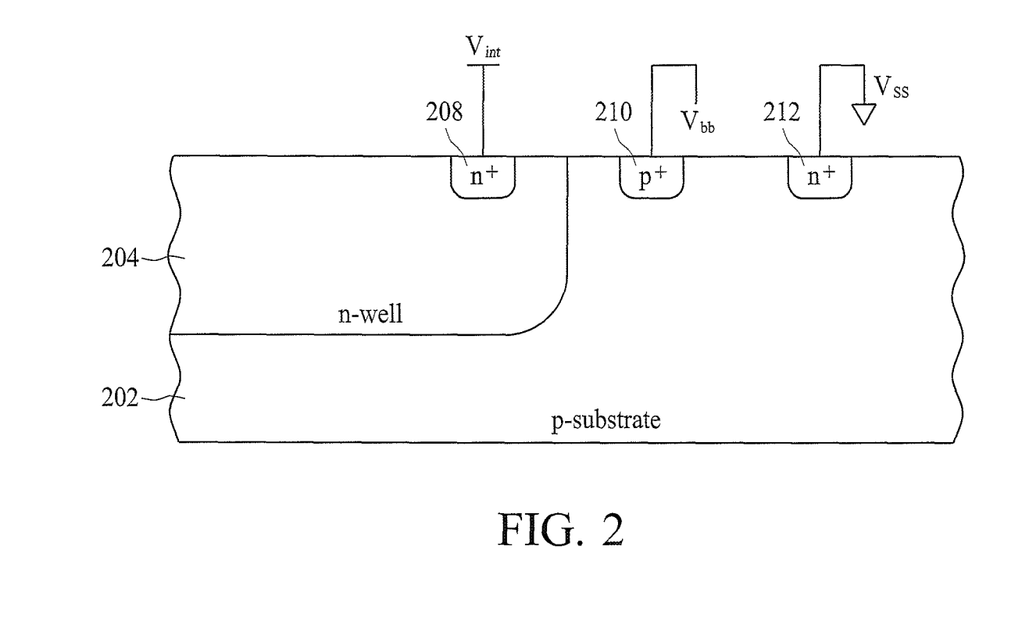
FIG. 2 is a schematic cross-sectional diagram illustrating a portion of a memory device according to an embodiment of the present invention.
Figure 3:
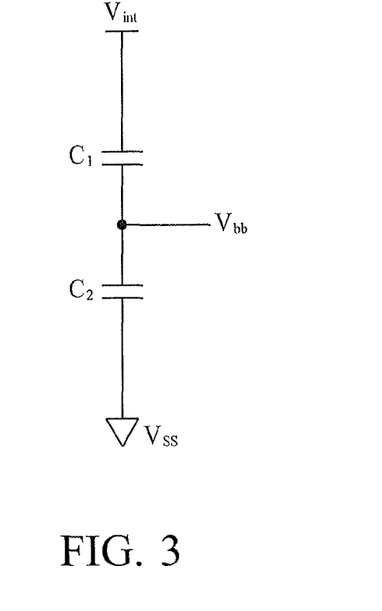
FIG. 3 is a schematic circuit diagram illustrating capacitive coupling between a substrate-bias voltage and an internal supply voltage.

FIG. 2 is a schematic cross-sectional diagram illustrating a portion of a memory device according to an embodiment of the present invention. FIG. 3 is a schematic circuit diagram illustrating capacitive coupling between a substrate-bias voltage and an internal supply voltage. Referring to FIG. 2, according to an embodiment, a memory device is built on a p-substrate 202 with an n-well 204. The n-well 204 has a well contact 208 coupled to an internal supply voltage $V_{int}$, and the p-substrate 202 has a substrate contact 210 coupled to a substrate-bias voltage $V_{bb}$. There is also an n+ region 212, from e.g. a memory peripheral circuit, in the p-substrate 202 that is coupled to ground $V_{ss}$. The n-well 204 may, for example, be used to house one or more p-wells (not shown) in which memory cells are disposed and therefore has a large area.

Referring to both FIGS. 2 and 3, the substrate-bias voltage $V_{bb}$ can be coupled to the supply voltage $V_{int}$, through a voltage divider formed by a p-n junction capacitance $C_1$ of the p-substrate 202 and n-well 204, and a p-n junction capacitance $C_2$ of the p-substrate 202 and n+ region 212. Because the area of the n-well is large, the capacitive coupling effect is significant and could cause a transient supply voltage $V_{int}$ during power-up of the memory device to induce a transient substrate-bias voltage $V_{bb}$ that could cause latchup in, for example, an associated parasitic circuit of a CMOS memory peripheral circuit of the memory device. Although the above-illustrated example is based on a CMOS DRAM device, the present invention may alternatively be embodied in any suitable CMOS memory device or other CMOS integrated circuit device to reduce latchup during power-up of the memory device or other integrated circuit device.

Figure 4:
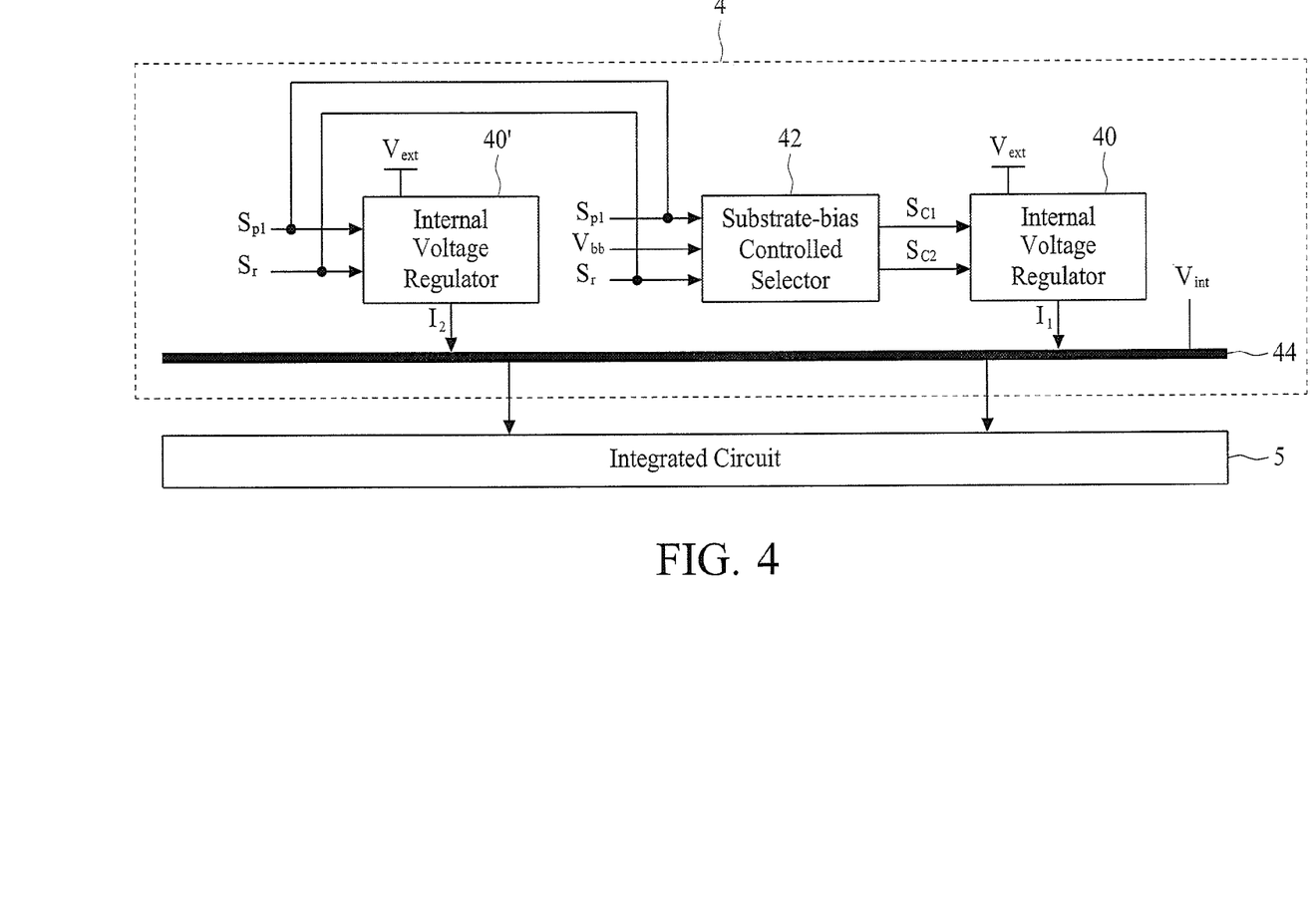
FIG. 4 is a schematic block diagram illustrating a memory device using a voltage generating system according to an embodiment of the present invention.

FIG. 4 is a schematic block diagram illustrating a memory device using a voltage generating system according to an embodiment of the present invention. Referring to FIG. 4, according to an embodiment, the memory device includes an integrated circuit 5, and a voltage generating system 4. The integrated circuit 5 may be a memory cell array or a memory peripheral circuit that has the issue of coupling between the supply voltage $V_{int}$ and the substrate-bias voltage $V_{bb}$ as described above. The voltage generating system 4 includes a first internal voltage regulator 40 and a first substrate-bias controlled selector 42.

Figure 5:
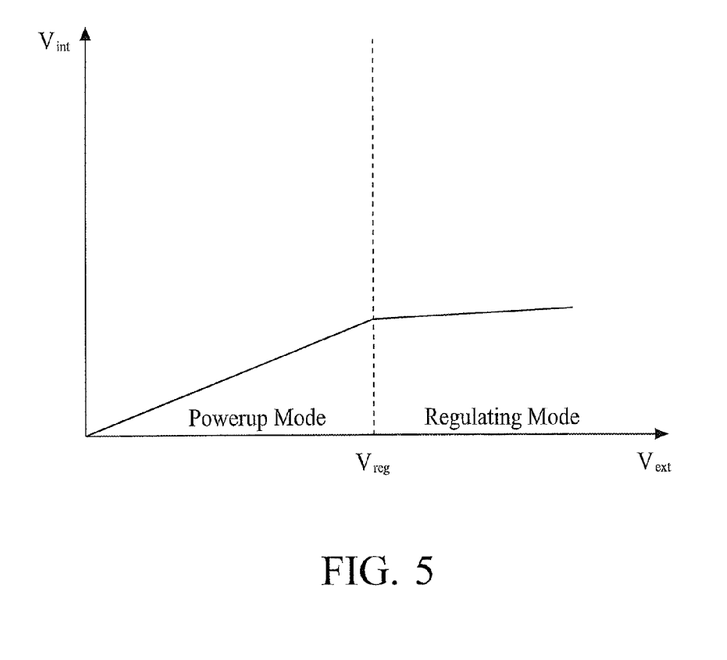
FIG. 5 is a schematic voltage characteristic curve of an internal voltage regulator according to an embodiment of the present invention.

FIG. 5 is a schematic voltage characteristic curve of the internal voltage regulator according to an embodiment of the present invention. Referring to FIGS. 4 and 5, the first internal voltage regulator 40 is configured to supply a current $I_1$ to pull an internal supply voltage $V_{int}$ to substantially a regulated level $V_{reg}$ and maintain substantially at the regulated level $V_{reg}$. According to an embodiment, the first internal voltage regulator 40 receives a first control signal $S_{c1}$ and a second control signal $S_{c2}$. In response to the first control signal $S_{c1}$, the first internal voltage regulator 40 powers up normally by shunting the internal supply voltage $V_{int}$ to an external supply voltage $V_{ext}$ until both the external supply voltage $V_{ext}$ and the internal supply voltage $V_{int}$ reach the regulated level $V_{reg}$, or the first internal voltage regulator 40 disables shunting. In response to the second control signal $S_{c2}$, the first internal voltage regulator 40 assumes normal operation, whereby the internal supply voltage $V_{int}$ is maintained at the regulated level $V_{reg}$, or the first internal voltage regulator 40 disables regulating.

Referring to FIGS. 4 and 5, the first substrate-bias controlled selector 42 is configured to receive a regulator power-up mode signal $S_{p1}$, a regulating mode signal $S_r$ and a substrate-bias voltage $V_{bb}$ of a substrate (not shown). When the substrate-bias voltage $V_{bb}$ is smaller than a first predetermined voltage, the first substrate-bias controlled selector 42 forwards the regulator power-up mode signal $S_{p1}$ and the regulating mode signal $S_r$ respectively as the first control signal $S_{c1}$ and the second control signal $S_{c2}$, so that the first internal voltage regulator 40 powers up and operates normally respectively under the power up mode and regulating mode shown in FIG. 5. According to an embodiment, the regulator power up mode signal $S_{p1}$ is generated by detecting whether the levels of the external supply voltage $V_{ext}$ and the internal supply voltage $V_{int}$ has reached the regulated level $V_{reg}$. When the substrate-bias voltage $V_{bb}$ is larger than or equal to the first predetermined voltage, the first substrate-bias controlled selector 42 sends disabling signals as the first control signal $S_{c1}$ and the second control signal $S_{c2}$ so that the first internal voltage regulator 40 is disabled. The first predetermined voltage is smaller than or equal to a forward voltage of a p-n junction formed with the substrate. According to an embodiment, the p-n junction is formed by the p-substrate 202 and n-well 204 shown in FIG. 2.

Referring to FIGS. 2, 4 and 5, according to an embodiment, the voltage generating system 4 further includes a second internal voltage regulator 40' configured to receive the regulator power-up mode signal $S_{p1}$ and the regulating mode signal $S_r$, and supply a current $I_2$ to pull the internal supply voltage $V_{int}$ to substantially the regulated level $V_{reg}$ and maintain substantially at the regulated level $V_{reg}$ by taking the regulator power-up mode signal $S_{p1}$ and the regulating mode signal $S_r$ into consideration. According to an embodiment, the voltage generating system 40 further includes a power bus 44 coupled to the integrated circuit 5 for distributing the internal supply voltage $V_{int}$ to the integrated circuit 5. By disabling the first internal voltage regulator 40 before the substrate-bias voltage $V_{bb}$ reaches the level of the forward voltage that could forward bias the p-n junction formed by the p-substrate 202 and n-well 204, the current $I_1$ is not supplied to the power bus 44 to pull the internal supply voltage $V_{int}$, and the internal supply voltage $V_{int}$ is not ramped up so quickly that the substrate-bias voltage $V_{bb}$ causes the p-n junction to be forward biased and triggers latchup.

Figure 6:
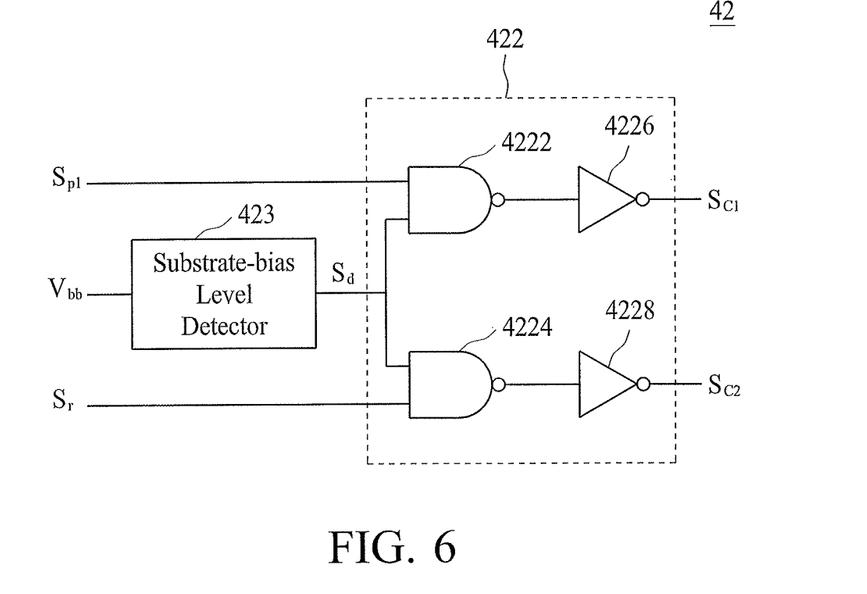
FIG. 6 is a schematic circuit diagram illustrating a substrate-bias controlled selector according to an embodiment of the present invention.

FIG. 6 is a schematic circuit diagram illustrating a substrate-bias controlled selector according to an embodiment of the present invention. Referring to FIG. 6, according to an embodiment, the first substrate-bias controlled selector 42 includes a substrate-bias level detector 423 and a logic control circuit 422. The substrate-bias level detector 423 is configured to generate a detect signal $S_d$ indicating whether the substrate-bias voltage is smaller than the first predetermined voltage. The logic control circuit 422 receives the detect signal $S_d$, the regulator power-up mode signal $S_{p1}$ and the regulating mode signal $S_r$, and in response to the detect signal $S_d$, the logic control circuit 422 forwards the regulator power-up mode signal $S_{p1}$ and the regulating mode signal $S_r$ as the first control signal $S_{c1}$ an the second control signal $S_{c2}$, or sends disabling signals as the first control signal $S_{c1}$ and the second control signal $S_{c2}$.

Referring to FIG. 6, according to an embodiment, the first logic control circuit 422 includes a first AND gate implemented by connecting a first NAND gate 4222 to a first inverter 4226, and a second AND gate implemented by connecting a second NAND gate 4224 to a second inverter 4228. The first NAND gate 4222 has a first input and a second input respectively coupled to the detect signal $S_d$ and the regulator power-up mode signal $S_{p1}$, so that the first inverter 4226 outputs the regulator power-up mode signal $S_{p1}$ and the disabling signal (a logic low level signal in this embodiment) when the detect signal $S_d$ is at a logic high level and a logic low level, respectively. The second NAND gate 4224 has a first input and a second input respectively coupled to the detect signal $S_d$ and the regulating mode signal $S_r$, so that the second inverter 4228 outputs the regulating mode signal $S_r$ and the disabling signal (a logic low level signal in this embodiment) when the detect signal $S_d$ is at the logic high level and the logic low level, respectively.

Figure 7:
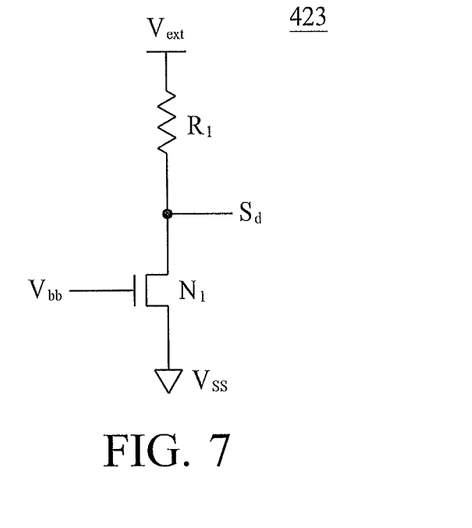
FIG. 7 is a schematic circuit diagram illustrating a substrate-bias level detector according to an embodiment of the present invention.

FIG. 7 is a schematic circuit diagram illustrating a substrate-bias level detector according to an embodiment of the present invention. Referring to FIG. 7, according to an embodiment, the substrate-bias level detector 423 includes a resistive element $R_1$ and a switch element $N_1$. The resistive element $R_1$ is configured to couple a terminal outputting the detect signal $S_d$ to the external supply voltage $V_{ext}$. The resistive element $R_1$ may be a resistor or a semiconductor device. The switch element $N_1$ is configured to couple the terminal outputting the detect signal $S_d$ to ground $V_{ss}$ when the substrate-bias voltage $V_{bb}$ is greater than or equal to the first predetermined voltage, wherein the first predetermined voltage is a threshold voltage of the switch element $N_1$. According to an embodiment, the switch element $N_1$ is an NMOS transistor.

Figure 8:
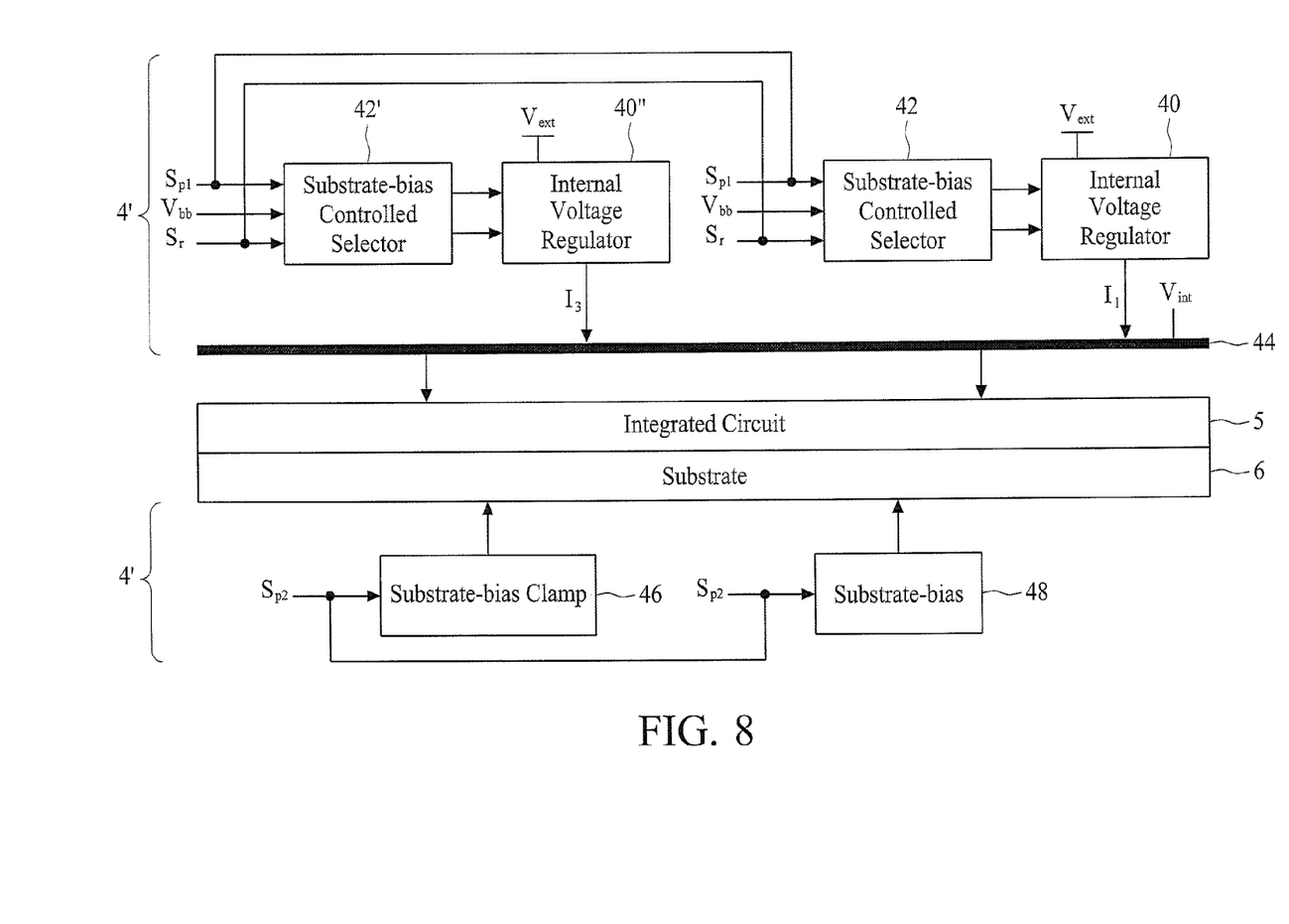
FIG. 8 is a schematic block diagram illustrating a memory device using a voltage generating system according to another embodiment of the present invention.

FIG. 8 is a schematic block diagram illustrating a memory device using a voltage generating system according to another embodiment of the present invention. The embodiment shown in FIG. 8 is different from the embodiment shown in FIG. 4 in that the voltage generating system 4' shown in FIG. 8 further includes a third internal voltage regulator 40'' and a second substrate-bias controlled selector 42'. The third internal voltage regulator 40'' is configured to supply a current $I_3$ to pull the internal supply voltage $V_{int}$ to substantially the regulated level and maintain substantially at the regulated level. The second substrate-bias controlled selector 42' is configured to receive the regulator power-up mode signal $S_{p1}$ and the substrate-bias voltage $V_{bb}$, and control the third internal voltage regulator 40'' such that when the substrate-bias voltage $V_{bb}$ is smaller than a second predetermined voltage, the third internal voltage regulator 40'' powers up and operates normally by respectively taking the regulator power-up mode signal $S_{p1}$ and the regulating mode signal $S_r$ into consideration, and when the substrate-bias voltage $V_{bb}$ is larger than or equal to the second predetermined voltage, the third internal voltage regulator 40'' is disabled, wherein the second predetermined voltage is smaller than the first predetermined voltage. In this way, the third internal voltage regulator 40'' is disabled first when the substrate-bias voltage $V_{bb}$ reaches the second predetermined voltage and only when the substrate-bias voltage $V_{bb}$ still rises to level of the first predetermined voltage will the first internal voltage regulator 40 be disabled. According to an embodiment, the first predetermined voltage and the second predetermined voltage are threshold voltages of switch elements $N_1$ show in FIG. 7, and may be adjusted with different dopings.

Referring to FIG. 8, according to an embodiment, the voltage generating system 4' further includes a substrate-bias pump 48 configured to receive a delayed power-up mode signal $S_{p2}$ and generate the negative substrate-bias voltage $V_{bb}$ for a substrate 6 on which the integrated circuit 5 is built when the delayed power-up mode signal $S_{p2}$ indicates the memory device has powered up. According to an embodiment, the voltage generating system 4' further includes a substrate-bias clamp 46 configured to receive the delayed power-up mode signal $S_{p2}$ and clamp the substrate-bias voltage $V_{bb}$ to ground $V_{ss}$ when the delayed power-up mode signal $S_{p2}$ indicates the memory device is still being powered up. According to this embodiment, the substrate-bias controlled selectors 42, 42' can work in coordination with the substrate-bias clamp 46 to reduce the number of internal voltage regulators 40, 40'' being disabled. According to an embodiment, the delayed power-up mode signal $S_{p2}$ is generated by determining when the internal supply voltage $V_{int}$ has reached the regulated level plus some time delay.

Figure 9:
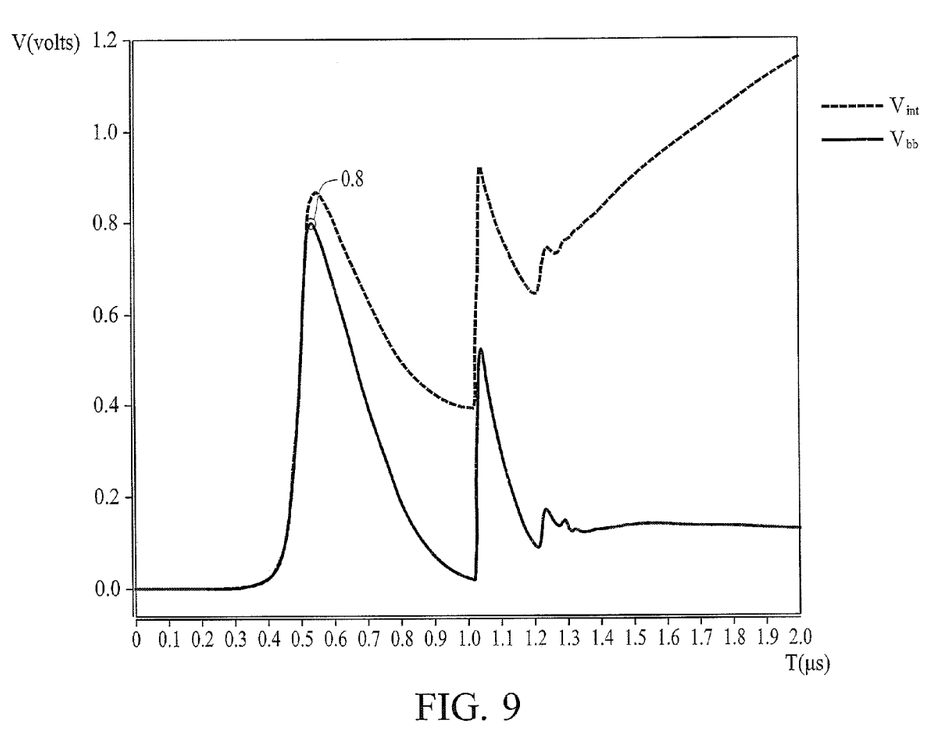
FIGS. 9 and 10 are experimental results respectively showing the levels of the coupled internal supply voltage and substrate-bias voltage of a prior art memory device and a memory device according to an embodiment of the present invention.
Figure 10:
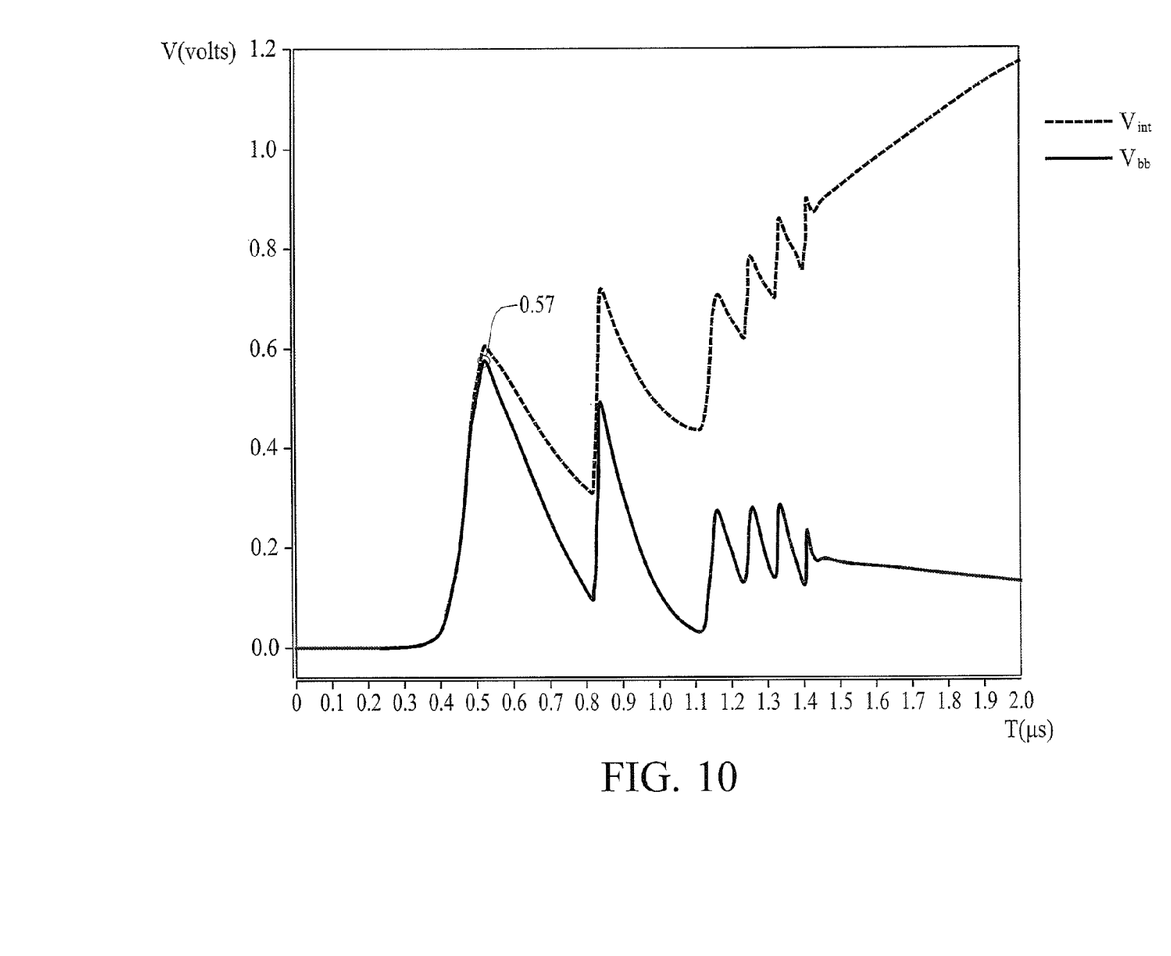

FIGS. 9 and 10 are experimental results respectively showing the levels of the coupled internal supply voltage and substrate-bias voltage during power-up of a prior art memory device and a memory device according to an embodiment of the present invention. As shown in FIG. 9, when the prior art memory device is powered up at around 0.4 µs, the substrate-bias voltage $V_{bb}$ coupled to the internal supply voltage $V_{int}$ ramps up to the highest level at 0.8 V, a level that can forward bias a p-n junction formed by the substrate. In contrast, as shown in FIG. 10, when the memory device according to an embodiment of the present invention is powered up at around 0.4 µs, the substrate-bias voltage $V_{bb}$ coupled to the internal supply voltage $V_{int}$ ramps up to the highest level at 0.57 V, which is safe from forward biasing the p-n junction.

In summary, the present invention is directed to a voltage generating system and memory device using the same that disable an internal voltage regulator based on a detected substrate-bias voltage level, so as to effectively control a substrate-bias voltage to be within a bound that could trigger latchup in the memory device.

Although the present invention and its advantages have been described in detail, it should be understood that various changes, substitutions and alterations can be made herein without departing from the spirit and scope of the invention as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A voltage generating system, comprising:
a first internal voltage regulator, configured to supply a current to pull an internal supply voltage to substantially a regulated level and maintain substantially at the regulated level; and
a first substrate-bias controlled selector, configured to receive a regulator power-up mode signal, a regulating mode signal and a substrate-bias voltage of a substrate, and control the first internal voltage regulator such that when the substrate-bias voltage is smaller than a first predetermined voltage, the first internal voltage regulator powers up and operates normally by respectively taking the regulator power-up mode signal and the regulating mode signal into consideration, and when the substrate-bias voltage is larger than or equal to the first predetermined voltage, the first internal voltage regulator is disabled, wherein the first predetermined voltage is smaller than or equal to a forward voltage of a p-n junction formed with the substrate.

2. The voltage generating system according to claim 1, wherein the first substrate-bias controlled selector comprises:
a substrate-bias level detector, configured to generate a detect signal indicating whether the substrate-bias voltage is smaller than the first predetermined voltage; and
a logic control circuit, configured to receive the detect signal, the regulating power-up mode signal and the regulating mode signal and forward the regulator power-up mode signal and the regulating mode signal to the first internal voltage regulator, or send disabling signals to the first internal voltage regulator in response to the detect signal.

3. The voltage generating system according to claim 2, wherein the substrate-bias level detector comprises:
a resistive element, configured to couple a terminal outputting the detect signal to an external supply voltage; and
a switch element, configured to couple the terminal outputting the detect signal to ground when the substrate-bias voltage is greater than or equal to the first predetermined voltage, wherein the first predetermined voltage is a threshold voltage of the switch element.

4. The voltage generating system according to claim 3, wherein the switch element is an NMOS.

5. The voltage generating system according to claim 2, wherein the logic control circuit comprises:
a first AND gate, wherein a first input and a second input of the first AND gate are respectively coupled to the detect signal and the regulator power-up mode signal, so that the first AND gate outputs the regulator power-up mode signal and the disabling signal when the detect signal is at a logic high level and a logic low level, respectively; and
a second AND gate, wherein a first input and a second input of the second AND gate are respectively coupled to the detect signal and the regulating mode signal, so that the second AND gate outputs the regulating mode signal and the disabling signal when the detect signal is at the logic high level and the logic low level, respectively.

6. The voltage generating system according to claim 1, wherein the regulator power-mode signal causes the first internal voltage regulator to couple the internal supply voltage to an external supply voltage when the internal supply voltage and/or the external supply voltage is below the regulated level.

7. The voltage generating system according to claim 1, further comprising:
a second internal voltage regulator, configured to receive the regulator power-up mode signal and the regulating mode signal, and supply a current to pull the internal supply voltage to substantially the regulated level and maintain substantially at the regulated level by taking the regulator power-up mode signal and the regulating mode signal into consideration.

8. The voltage generating system according to claim 1, further comprising:
a third internal voltage regulator, configured to supply a current to pull the internal supply voltage to substantially the regulated level and maintain substantially at the regulated level; and
a second substrate-bias controlled selector, configured to receive the regulator power-up mode signal and the substrate-bias voltage, and control the third internal voltage regulator such that when the substrate-bias voltage is smaller than a second predetermined voltage, the third internal voltage regulator powers up and operates normally by respectively taking the regulator power-up mode signal and the regulating mode signal into consideration, and when the substrate-bias voltage is larger than or equal to the second predetermined voltage, the third internal voltage regulator is disabled, wherein the second predetermined voltage is smaller than the first predetermined voltage.

9. The voltage generating system according to claim 1, further comprising:
a substrate-bias pump, configured to generate the substrate-bias voltage.

10. The voltage converter for the memory device according to claim 1, further comprising:
a voltage clamp, configured to clamp the substrate-bias voltage to ground.

11. A memory device, comprising:
an integrated circuit, wherein the integrated circuit is a memory cell array or a memory peripheral circuit; and
a voltage generating system comprising:
a first internal voltage regulator, configured to supply a current to pull an internal supply voltage to substantially a regulated level and maintain substantially at the regulated level; and
a first substrate-bias controlled selector, configured to receive a regulator power-up mode signal, a regulating-mode signal and a substrate-bias voltage, and control the first internal voltage regulator such that when the substrate-bias voltage is smaller than a first predetermined voltage, the first internal voltage regulator powers up and operates normally by respectively taking the regulator power-up mode signal and the regulating mode signal into consideration, and when the substrate-bias voltage is larger than or equal to the first predetermined voltage, the first internal voltage regulator is disabled, wherein the first predetermined voltage is smaller than or equal to a forward voltage of a p-n junction formed with the substrate; and
a power bus coupled to the integrated circuit and configured to distribute the internal supply voltage to the integrated circuit.

12. The memory device according to claim 11, wherein the first substrate-bias controlled selector comprises:
a substrate-bias level detector, configured to generate a detect signal indicating whether the substrate-bias voltage is smaller than the first predetermined voltage; and
a logic control circuit, configured to receive the detect signal, the regulator power-up mode signal and the regulator mode signal, and forward the regulator power-up mode signal and the regulating mode signal to the first internal voltage regulator, or send disabling signals to the first internal voltage regulator in response to the detect signal.

13. The memory device according to claim 12, wherein the substrate-bias level detector comprises:
a resistive element, configured to couple a terminal outputting the detect signal to an external supply voltage; and
a switch element; configured to couple the terminal outputting the detect signal to ground when the substrate-bias voltage is greater than or equal to the first predetermined voltage, wherein the first predetermined voltage is a threshold voltage of the switch element.

14. The memory device according to claim 13, wherein the switch element is an NMOS.

15. The memory device according to claim 12, wherein the logic control circuit comprises:
a first AND gate, wherein a first input and a second input of the first AND gate are respectively coupled to the detect signal and the regulator power-up mode signal, so that the first AND gate outputs the regulator power-up mode signal and the disabling signal when the detect signal is at a logic high level and a logic low level, respectively; and
a second AND gate, wherein a first input and a second input of the second AND gate are respectively coupled to the detect signal and the regulating mode signal, so that the second AND gate outputs the regulating mode signal and the disabling signal when the detect signal is at the logic high level and the logic low level, respectively.

16. The memory device according to claim 11, wherein the regulator power-mode signal causes the first voltage regulating system to couple the internal supply voltage to an external supply voltage when the internal supply voltage and/or the external supply voltage is below the regulated level.

17. The memory device according to claim 11, further comprising:
a second internal voltage regulator, configured to receive the regulator power-up mode signal and the regulating mode signal, and supply a current to pull the internal supply voltage to substantially the regulated level and maintain substantially at the regulated level by taking the regulator power-up mode signal and the regulating mode signal into consideration.

18. The memory device according to claim 11, further comprising:
a third internal voltage regulator, configured to supply a current to pull the internal supply voltage to substantially the regulated level and maintain substantially at the regulated level; and
a second substrate-bias controlled selector, configured to receive the regulator power-up mode signal and the substrate-bias voltage, and control the third internal voltage regulator such that when the substrate-bias voltage is smaller than a second predetermined voltage, the third internal voltage regulator powers up and operates normally by respectively taking the regulator power-up mode signal and the regulating mode signal into consideration, and when the substrate-bias voltage is larger than or equal to the second predetermined voltage, the third internal voltage regulator is disabled, wherein the second predetermined voltage is smaller than the first predetermined voltage.

19. The memory device according to claim 11, further comprising:
a substrate-bias pump, configured to generate the substrate-bias voltage.

20. The memory device according to claim 11, further comprising:
a voltage clamp, configured to clamp the substrate-bias voltage to ground.

* * * * *